United States Patent [19]

Senra

[11] Patent Number: 5,186,648
[45] Date of Patent: Feb. 16, 1993

[54] INSULATED WIRE CONTACT CLAMP

[76] Inventor: Enrique M. Senra, 740 E. 11 Pl., Hialeah, Fla. 33013

[21] Appl. No.: 896,650

[22] Filed: Jun. 10, 1992

[51] Int. Cl.$^5$ .......................................... H01R 13/00
[52] U.S. Cl. ............................................... 439/409
[58] Field of Search .............................. 439/389–425, 439/835, 838, 822

[56] References Cited

U.S. PATENT DOCUMENTS 1,738,287 12/1929 Dirksen ............................ 439/409
2,237,187 4/1941 Manttilla ........................... 439/409

Primary Examiner—Joseph H. McGlynn

[57] ABSTRACT

An insulated electric wire contact clamp for measuring voltage and resistance in electrical wires without removing the insulation. Each clamp includes a pair of elongated gripping members which are pivotally connected and each of which has a pair of jaws on one end. One of the jaws has an anvil to accept an electrical wire and the other jaw supports ao driving pin or needle for perforating the insulation of the wire and making contact with the metallic core. The pin or needle projects from the jaw support a determined distance by means of an adjusting screw. The wire anvil jaw can accommodate wires of a different thicknesses and has a hole in the center to prevent damage to the pin or needle.

6 Claims, 2 Drawing Sheets

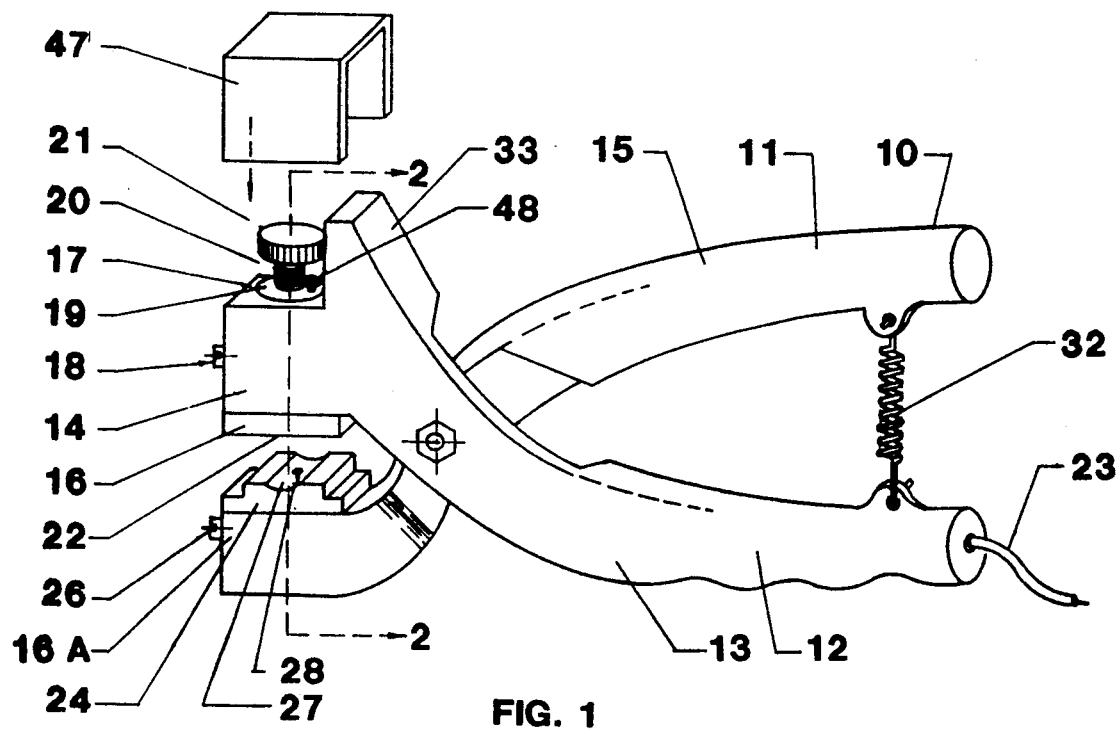
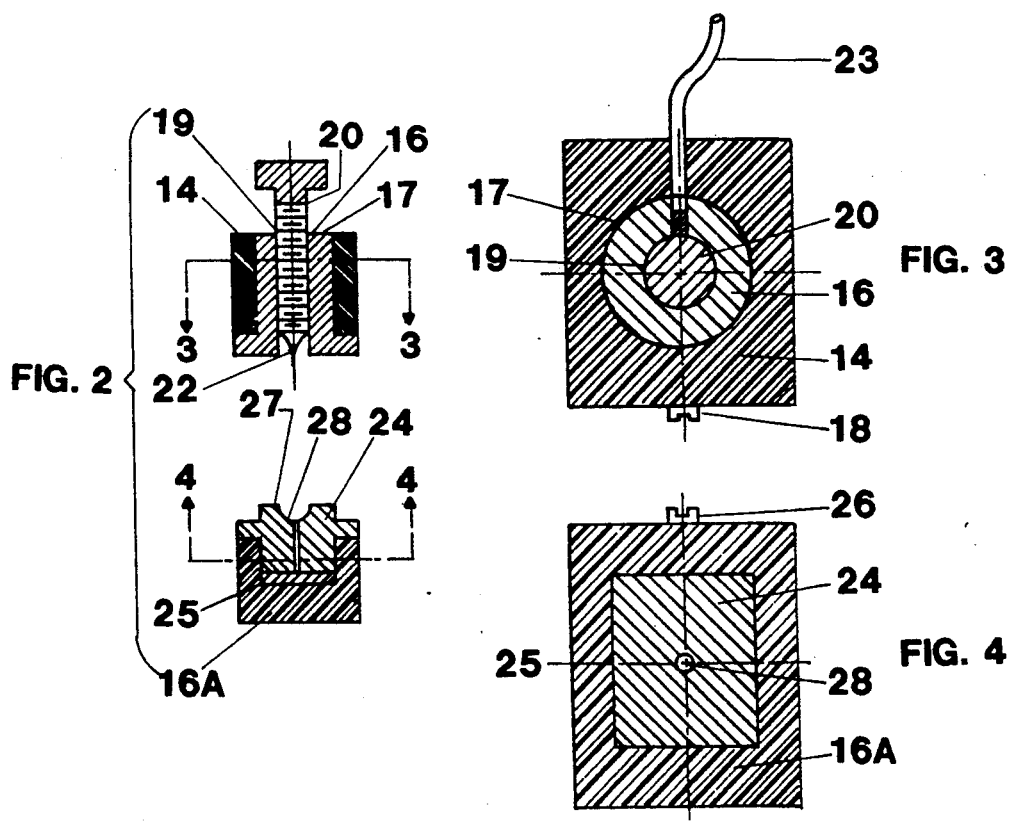

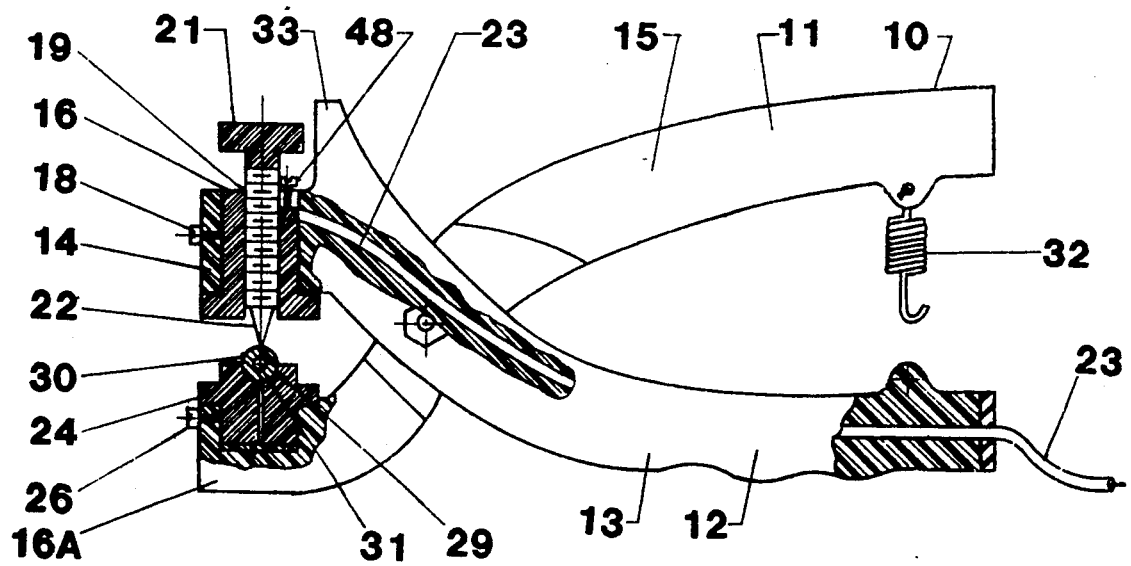
FIG. 5
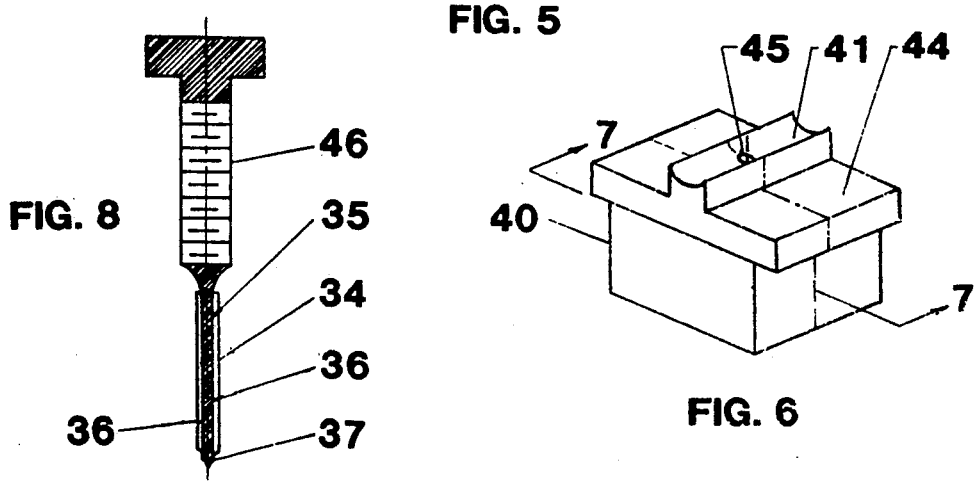
FIG. 8
FIG. 6
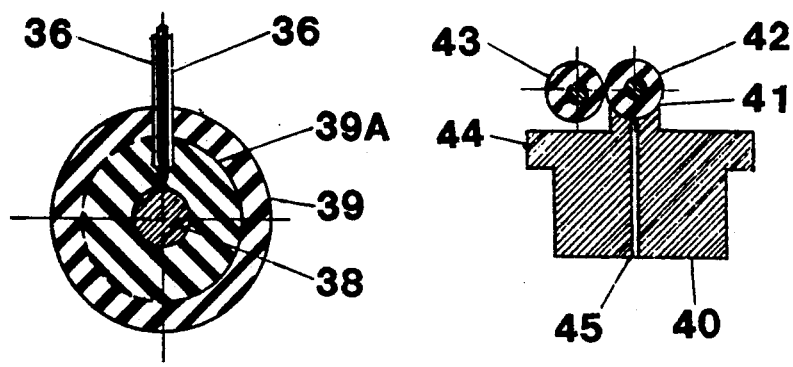
FIG. 9
FIG. 7

INSULATED WIRE CONTACT CLAMP

BACKGROUND OF THE INVENTION

This invention relates to an electric wire contact clamp for measuring in sets of 2 or more electrical conditions such as voltage, and resistance in electrical wires without removing the insulating material.

At present, when it is required to measure voltage between 2 insulated electrical wires, it is necessary to locate the sites where the wires are connected to do so. But in many instances it is convenient to measure the voltage in an insulated electrical wire at a distant location from a connection, in which case to perform the test the insulation must removed and thereafter the damage repaired. Besides being dangerous when testing a wire when the power is on, it takes time to remove the insulation and do the repair work.

The clamp of this invention provides an efficient, safe and simple method to connect the insulated wire to the test clamp, without any risk during the operation.

In the same fashion this invention provides a path for easily measuring the resistance between different insulated wires when the power is off.

In the case where the voltage, or resistance is to be measured between insulated wires and ground or chassis, the clamp of this invention will save time in performing these tests.

SUMMARY OF THE INVENTION

It is an object of this invention to provide an insulated electrical wire contact clamp that may be used singularly or in sets of 2 or more to measure voltage and resistance in electrical circuits without removing the insulation of the wire.

It is another object of the invention to provide adjustable means in the clamp to accommodate different sizes of pins or needles according to the type of wire insulation and wire metallic core. It is yet another object of the invention to provide adjustable means in the clamp to accommodate different thicknesses and types of wire to be tested.

The objects set forth herein and others which will become apparent hereinafter are accomplished by the provision of a pliers-like clamp made on non-conducting material such as plastics, with a pair of jaws which are in a parallel arrangement to each other whenever the handles are clamped together.

One of the jaws has a section for supporting the perforating pin or needle assembly whereas the other of the jaws has a section to support an assembly to hold the insulated wire in position in an "U" shaped anvil top surface, with a hole in its center to provide a path for the pin or needle in case that the pin or needle protrudes beyond the thickness of the wire, thus preventing breakage of the pin or needle.

In addition, means are provided to connect the pin or needle to a cable which extends from the clamp itself to be connected to the appropriate electrical testing equipment. When reference is made in this invention, to a pin or needle, it is understood that the pin or needle assembly is capable of accommodating the type of pin or needle required for a given insulated wire or cable so that the perforation is minimum.

In essence, this invention provides a clamp capable of accepting different types and thicknesses of insulated wires or cables by simply changing the adjusting screw that supports the pin or needle and/or changing the anvil to accommodate the required wire or cable type and thickness.

When testing coaxial wires, a special pin or needle will be used to prevent contact of the shielding in the coaxial wire to the pin or needle as made evident in the description of the drawings.

Similarly, when testing cords with 2 or more wires, the wire anvil will be adapted to permit positioning one wire at a time in order to perform the testing.

Finally, the pin or needle assembly may be adapted to contain 2 or more adjusting screws with corresponding pin or needles, with a corresponding anvil and 2 or more external cables when becomes necessary to test cords with 2 or more wires with a single clamp, by merely positioning the pins or needles in a diagonal fashion to prevent contact between adjacent adjusting screws and in alignment with the respective wires.

BRIEF DESCRIPTION OF THE DRAWINGS

With the above and other objects in view, as hereinafter appear, the advantages of the invention will be better described and understood from the accompanying drawings illustrating the invention, in which:

FIG. 1—is a perspective view of the clamp of this invention.

FIG. 2—is a sectional view of the clamp taken along long 1—1 of FIG. 1.

FIG. 3—is an enlarged sectional plan view of the pin or needle supporting jaw taken along line 2—2 of FIG. 2.

FIG. 4—is an enlarged sectional plan view of the wire anvil supporting jaw taken along line 3—3 of FIG. 2.

FIG. 5—is a side perspective view partly in section of the pin or needle assembly and wire anvil supporting jaws of the invention in use with a cross section of an insulted wire, showing the perforated insulation and the pin or needle in contact with the metallic core of the wire or cable as well as the connection of the pin or needle to the core of the cable that emerges from the end of the corresponding handle and to be connected to an electrical measuring apparatus.

FIG. 6—is an enlarged side perspective view of a universal anvil which may be installed in the anvil jaw for testing cords with 2 or more wires, by testing one wire at a time.

FIG. 7—is an enlarged sectional view of the wire anvil of FIG. 6 taken along lines 4—4, with a 2- wire cord in position.

FIG. 8—is an enlarged sectional view of an adjusting screw fitted with a special pin or needle coated with a ceramic or insulating abrasion resistant coating except at its end tip for use in testing coaxial cables.

FIG. 9—is an enlarged sectional view of an insulated coaxial wire showing the pin or needle of FIG. 8 contacting only the core of the coaxial wire.

DETAILED DESCRIPTION OF THE DRAWINGS

The illustrated embodiment of the invention comprises a gripping clamp 10 for connecting the metal core of insulated wires or cables to electrical equipment for measuring voltage, and resistance by using the required number of clamps to be attached to each wire or cable in an electrical circuit.

The clamp 10 includes elongated members 11 and 12 pivotally connected to form a pliers-like clamp 10.

Member 12 has a handle 13 and jaw 14 to support a pin or needle assembly. Member 11 has a handle 15 and jaw 16A to support a wire anvil assembly.

The pin or needle assembly comprises a ratchet drive 16 a portion of which is disposed within bore 17 of the pin or needle assembly jaw 14 as shown in FIGS. 1 and 2.

The ratchet drive 16 is held in position within bore 17 by means of screw 18 as shown in FIGS. 1, 3 and 5.

Ratchet drive 16 has a round bore 19 in the center containing an adjusting screw 20 which is threaded into threads in bore 19. Said adjusting screw 20 has a knurled head 21 to adjust the depth that the adjusting screw 20 extends into round threaded bore 19 in the ratchet drive 16. The head of the screw may also be made of an insulating material such as plastics.

A pin or needle 22 is attached to the lower section of the adjusting screw 20 in such a manner that the pin or needle 22 will travel a distance dictated by the attached adjusting screw 20 and projects from the lower surface of ratchet drive 16.

Means are provided to keep contact of the adjusting screw 20 with a wire or cable 23 by mans of screw 48 which contacts the core of cable 23 so that cable 23 emerges from the end of handle 13 to be connected to an electrical measuring equipment as shown in FIGS. 1 and 5.

The wire or cable anvil comprises a rectangular plastic anvil 24 which rests into a rectangular recess 25 in supporting jaw 16A to accept said anvil, which is secured in place by means of screw 26 attached to jaw 16A as seen in FIGS. 1, 4 and 5.

The wire or cable anvil 24 which may be made of a plastic material has a "U" channel or groove 27 at the top of said anvil to accommodate the wire or cable of a given thickness. By means of screw 26 the anvil 24 can be easily changed for another type to accommodate other wire or cable thicknesses, said screw 26 attached to jaw 16A holding the anvil 24 in position.

In the center of the wire or cable anvil 24 a hole 28 is provided to permit the pin or needle 22 to go through the hole 28 without any damage in case that the depth adjustment was incorrectly set.

In operation or usage a section of the insulated wire 29 is placed into the "U" grove or channel 27 of the wire anvil 24 that rests on support jaw 16A as shown in FIG. 5. The pin or needle 22 that is contained in the pin or needle assembly which carries along the protruding pin or needle 22 previously adjusted by screw head 21 is squeezed by means of handle 15 along with handle 13 so that the pin and needle 22 perforates the insulation 30 of the wire or cable 29 and makes contact with the metallic core of the wire or cable 31 and therefore the pin or needle 22 attached to the adjusting screw 21 makes contact with the core of cable 23 by means of screw 48 and cable 23 then is connected to the electrical measuring equipment. A detachable spring 32 may be attached whenever is convenient to both members 11 and 12, in order to hold the clamp in position and hold the pin or needle 22 in close contact with the metallic core of the wire or cable while the testing is performed.

The elongated members 11 and 12 are made of an insulating material such as plastic and member 12 has an extension 33 and plastic cover 47 which is positioned by pressure or other means to cover the screw 20 and protect the hand of the operator from accidentally making contact with the adjusting screw head 21 which may have an electrical potential when the power is on.

When measuring low voltages no other precautions may be necessary but, when higher voltages are to be measured more safety provisions must be added and the size of the clamp enlarged. To distinguish between polarities, different colors in the elongated members 11 and 12 may be used.

Different pins or needles attached to corresponding adjusting screws may be used to match the type and thickness of the insulated wire or cable under test. In that sense screw 46 depicted in FIG. 8 consists of a special pin or needle 34 consisting of a metallic body 35 coated with a ceramic or insulating abrasion resistant material 36 leaving only the tip of the pin or needle 37 free of said coating and permitting said metallic tip 37 to make contact with the metallic core 38 of a coaxial cable or wire 39, as illustrated in FIG. 9, and the portion of the pin or needle that is coated with said insulation 36 not making electrical contact with the shield 39A of the coaxial cable or wire.

In the same manner different wire or cable anvils 40 as depicted in FIGS. 6 and 7 may be exchanged to accommodate the thickness of a particular wire with its insulation by means of screw 26. In some applications, instead of having a "U" channel in the anvil, a "V" groove may prove better. This variation of wire or cable anvil is illustrated in FIGS. 6 and 7 consisting of a "universal" type anvil, capable of accepting cords with 2 or more wires. To that effect, the top section of the anvil 40 comprises a raised "U" channel or groove 41 to accept one of the wires in the cord, in the case of the illustration in FIG. 7 a 2-wire cord is shown, one of the 2 wires of the cord 42 is positioned inside the "U" channel or groove 41 and the other wire of the cord 43 remains above one of the recessed sides 44 of the anvil. First wire 42 is tested, and the other wire or wires are tested in the same manner by corresponding clamps. The hole 45 in the center of the anvil permits the pin or needle 22 to go through in case of an error thus preventing pin or needle breakage.

It is to be understood that the invention in not limited to the specific construction or embodiment illustrated and described, as the same is only illustrative of the principles involved, and various changes and adaptations may be made in the types of structures disclosed and in the mode of its usage without departing from the scope of the invention.

What is claimed is:

1. An insulated wire or cable contact clamp for measuring voltage, or resistance in electrical circuits without removing the wire or cable insulation, comprising:
    a) pair of pivotally connected elongated members, of an insulating material such as plastic, in a plier-like configuration, one of the members having a handle on one end and a support jaw having a pin or needle assembly in the other end, and the other of said elongated members having a handle on one end and a support jaw having a wire or cable anvil assembly on its other end, which opposes the pin or needle assembly on the other elongated member;
    b) pin or needle assembly, formed by a ratchet drive supported in the corresponding jaw by a circular bore in said jaw and held in position by screw means attached to the jaw. An adjusting screw threaded into a threaded bore in the center of the ratchet drive, said screw having a knurled head to adjust the screw travel inside the threaded bore inside the ratchet, and said screw attached at the other end opposed to the head, to a pin or needle, permitting the knurled head to move the pin or needle in either direction, and means to connect said adjusting screw to a cable that extends outside the clamp;

c) wire or cable anvil formed by a rectangular plastic anvil having a "U" channel or groove on its upper surface relative to the supporting jaw, to accommodate the thickness of a given wire or cable, said anvil supported and held in position by a screw threaded into the jaw, and said anvil having a hole in its center to permit passage of the pin or needle;

d) detachable spring that may be attached to appropriate sections of both elongated members of the plier-like clamp, in order to maintain close contact between the pin or needle and the metallic core of the wire or cable under test, when both handles of the clamp are squeezed.

2. An insulated wire or cable contact clamp, as set forth in claim 1, wherein the clamp has provisions to further protect the operator from exposure to high voltage or currents.

3. An insulated wire or cable contact clamp as set forth in claim 1, wherein the plastic body member of the clamp has a given color to distinguish the polarity of the connection.

4. An insulated wire or cable contact clamp as set forth in claim 1, wherein the pin or needle attached to the adjusting screw is coated in its entire body by a ceramic or insulating abrasion resistant material except at the tip of the pin or needle, for testing coaxial cables.

5. An insulated wire or cable contact clamp as set forth in claim 1, wherein the wire or cable anvil is adapted to accommodate cords with 2 or more wires to permit testing 1 wire at a time.

6. An insulated wire or cable contact clamp as set forth in claim 1, wherein the "U" channel or groove in the wire or cable anvil consists of a "V" groove.

* * * * *